United States Patent
Entsfellner et al.

(10) Patent No.: US 9,801,082 B2
(45) Date of Patent: Oct. 24, 2017

(54) VECTORIAL NETWORK ANALYSER

(71) Applicant: ROSENBERGER HOCHFREQUENZTECHNIK GMBH & CO. KG, Fridolfing (DE)

(72) Inventors: Christian Entsfellner, Fridolfing (DE); Holger Heuermann, Aachen (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 228 days.

(21) Appl. No.: 14/386,649

(22) PCT Filed: Mar. 25, 2013

(86) PCT No.: PCT/EP2013/000899
§ 371 (c)(1),
(2) Date: Sep. 19, 2014

(87) PCT Pub. No.: WO2013/143681
PCT Pub. Date: Oct. 3, 2013

(65) Prior Publication Data
US 2015/0071097 A1    Mar. 12, 2015

(30) Foreign Application Priority Data
Mar. 27, 2012    (DE) .................. 10 2012 006 195

(51) Int. Cl.
*H04W 24/06* (2009.01)
*G01R 35/00* (2006.01)
*G01R 27/32* (2006.01)

(52) U.S. Cl.
CPC ............ *H04W 24/06* (2013.01); *G01R 27/32* (2013.01); *G01R 35/005* (2013.01)

(58) Field of Classification Search
CPC ...... H04W 24/06; G01R 27/32; G01R 35/005
See application file for complete search history.

(56) References Cited

U.S. PATENT DOCUMENTS

| | | | |
|---|---|---|---|
| 8,989,243 B1 * | 3/2015 | Black ....................... | H04B 3/56 375/220 |
| 2010/0141305 A1 * | 6/2010 | Ortler .................. | G01R 35/005 327/117 |
| 2010/0204943 A1 * | 8/2010 | Heuermann ......... | G01R 35/005 702/85 |

FOREIGN PATENT DOCUMENTS

| DE | 10 2007 020073 A1 | 10/2008 |
|---|---|---|
| EP | 0473949 A2 | 3/1992 |

(Continued)

OTHER PUBLICATIONS

Anonymous: "High-End-Netzwerkanalysator—zukunftsweisend und extrem schnell". Online • 2005. pp. 26-31. XP002699987. Internet Retrieved from the Internet: URL:http://www.rohde-schwarz.de/file/n188_zva_de.pdf.

(Continued)

*Primary Examiner* — Chi H Pham
*Assistant Examiner* — Weibin Huang
(74) *Attorney, Agent, or Firm* — DeLio, Peterson & Curcio LLC; Robert Curcio

(57) ABSTRACT

A vectorial network analyzer (VNA) having at least one signal generator generating a particular RF output signal, and having n measuring ports, wherein an RF coupler is assigned to each measuring port and couples out an RF signal by running into the particular port from the outside, wherein the at least one signal generator is arranged and designed in such a manner that the latter supplies a particular RF output signal to at least one measuring port as an RF signal running out to the outside. Provision is made for an amplitude and/or a phase to be stored for the RF output signal for at least one signal generator in a retrievable manner on the basis of at least one parameter in a parameter field, wherein the RF signal generator is designed in such a manner that the latter generates the amplitude and/or phase (Continued)

of the RF output signal in a reproducible manner on the basis of at least this one parameter.

15 Claims, 3 Drawing Sheets

(56) References Cited

FOREIGN PATENT DOCUMENTS

| | | |
|---|---|---|
| JP | 02-272854 A | 11/1990 |
| JP | H10142273 A | 5/1998 |
| JP | 2001272428 A | 10/2001 |

OTHER PUBLICATIONS

Heuermann: 11 Untitled 11 2009, pp. 5-33. XP002699988. Internet Retrieved from the Internet: URL:http://www.heuermann.fh-aachen.de/files/download/diverse/coax.pdf.

Hui, Tang: The Application of Vector Network Analyzer's Time-domain Function to Ascertain the Break in the Coaxial Cable; Metrology & Measurement Technique, vol. 38 No. 6, pp. 48-49, 51, Jun. 30, 2011.

Will, Karl; Phase Measurement of RF Devices Using Phase-Shifting Interferometry; IEEE Transaction on Microwave Theory and Techniques, vol. 56, No. 11, Nov. 2008, pp. 2642-2647.

\* cited by examiner

VECTORIAL NETWORK ANALYSER

BACKGROUND OF THE INVENTION

1. Field of the Invention

The present invention relates to a vectorial network analyzer (VNA) having at least one signal generator which generates a particular RF output signal, and having n measuring ports, where n is an integer greater than or equal to one, wherein an RF coupler is assigned to each measuring port and the RF coupler is designed in such a manner that the RF coupler couples out an RF signal $b_n$ running into the particular port from the outside, wherein the at least one signal generator is arranged and designed in such a manner that the latter supplies a particular RF output signal to at least one measuring port as an RF signal $a_n$ running out to the outside.

The invention also relates to a method for determining scattering parameters of an electronic device under test, wherein at least one electromagnetic wave $a_n$ running into the device under test and at least one electromagnetic wave $b_n$ propagated from the device under test are determined and scattering parameters of the device under test are calculated in terms of amount and/or phase from the determined waves $a_n$ and $b_n$, wherein the at least one electromagnetic wave $b_n$ propagated from the device under test is measured by means of an RF coupler, and wherein the at least one electromagnetic wave $a_n$ running into the device under test is generated by at least one signal generator.

2. Description of Related Art

In the field of electronics, vectorial network analyzers (VNA) have for many years been used for the precise measurement of electronic linear components and components of active and passive circuits or assemblies at low frequencies (as LCR meters) and in the high frequency range into the THz range as well as the optical range. A VNA records the scattering parameters of n-port networks (n=1, 2, . . . ), which may be converted into 2n-pole parameters (e.g. Z- or Y-parameters). However, in the case of mid- and high-frequencies in particular (fast circuits, i.e., circuits in the MHz and GHz range), these recorded measured data display very high measuring errors. Nowadays, these measuring errors have also been immensely reduced in almost every NF device (LCR meters) by means of mathematical methods. An associated systematic error correction in the VNAs ensures that precise measurements of fast electronic components, i.e., components in the MHz and GHz range, with exclusively linear transmission behavior can be carried out at all.

The measuring accuracy of VNAs depends primarily on the availability of a method for systematic error correction and the associated calibration standard. In systematic error correction, within the so-called calibration procedure the reflection and/or transmission behavior of devices under test which are partially or wholly known are measured. Correction data (so-called error factors or coefficients) are obtained from these measured data using special calculation methods. With these correction data and a corresponding correction calculation, measured data can be obtained for any given device under test which are free of systematic errors in the VNA and the input lines (miscoupling=crosstalk, mismatches=reflections).

The usual form of describing the electrical behavior of components and circuits in high frequency technology (RF technology) is by means of the scattering parameters (also referred to as S-parameters). The scattering parameters interrelate not currents and voltages but wave characteristics. This form of representation is particularly well adapted to the physical conditions of RF technology. If necessary, these scattering parameters can be converted into other electrical network parameters which interrelate currents and voltages.

SUMMARY OF THE INVENTION

Bearing in mind the problems and deficiencies of the prior art, it is therefore an object of the present invention to provide a vectorial network analyzer having precise measurements of fast electronic components, i.e., components in the MHz and GHz range, with exclusively linear transmission behavior.

The above and other objects, which will be apparent to those skilled in the art, are achieved in the present invention which is directed to a vectorial network analyzer (VNA) comprising at least one signal generator which generates a particular RF output signal, and n measuring ports, where n is an integer greater than or equal to one, wherein an RF coupler is assigned to each measuring port and couples out an RF signal $b_n$ running into the particular port from the outside, wherein the at least one signal generator is arranged and designed in such a manner that the latter supplies a particular RF output signal to at least one measuring port as an RF signal $a_n$ running out to the outside, such that for the RF output signal of the at least one signal generator, an amplitude and/or a phase are stored retrievably in the VNA as a function of at least one parameter in a parameter field, wherein the at least one signal generator generates the RF output signal reproducibly in amplitude and/or phase as a function of at least this one parameter.

The at least one signal generator may include an RF synthesizer. The at least one parameter may be a frequency of the RF output signal, an output power of the signal generator, an ambient temperature, or a measuring time per frequency point, or any combination thereof. The at least one signal generator may include a phase-locked loop (PLL).

Each RF coupler may be assigned a measuring point which measures the respective RF signal $b_n$. A reference signal, comprising a quartz signal or a quartz oscillator signal (XCO signal), and having a frequency 10 MHz, may be provided such that this signal triggers a reception of RF signals $b_n$ at the corresponding RF coupler. The measuring point may be in the form of an A/D converter.

The RF coupler may be a directional coupler, such as a line coupler.

In a second aspect, the present invention is directed to a method for determining scattering parameters of an electronic device under test, wherein at least one electromagnetic wave $a_n$ running into the device under test and at least one electromagnetic wave $b_n$ propagated from the device under test are determined and scattering parameters of the device under test are calculated in terms of amount and/or phase from the determined waves $a_n$ and $b_n$, wherein the at least one electromagnetic wave $b_n$ propagated from the device under test is measured by an RF coupler, and wherein the at least one electromagnetic wave $a_n$ running into the device under test is generated by at least one signal generator, such that the at least one electromagnetic wave $a_n$ running into the device under test is determined from a stored parameter field in which the amplitude and/or phase for the electromagnetic wave $a_n$ generated by the signal generator is stored as a function of at least one parameter which influences the generation of the signal by the signal generator, wherein at least one parameter is determined and the amplitude and/or phase of the electromagnetic wave $a_n$ generated by the signal generator is derived from the parameter field for this at least one parameter.

An RF synthesizer may be used as signal generator. The at least one parameter may include a frequency of the RF output signal, an output power of the signal generator, an ambient temperature, or a measuring time per frequency point, or any combination thereof.

The at least one signal generator may include a phase-locked loop (PLL) and be coupled to a reference signal, in particular a reference signal of a quartz oscillator.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-5 of the drawings in which like numerals refer to like features of the invention.

Figure 1:
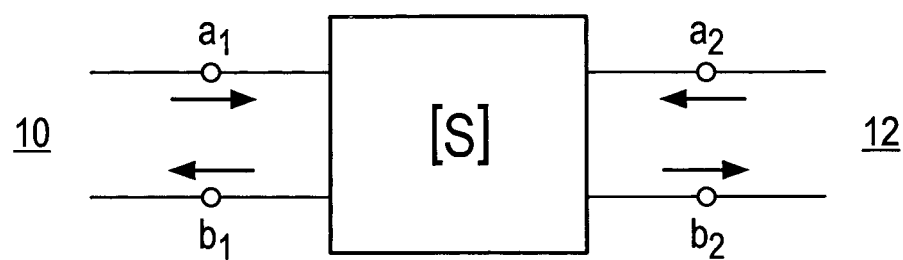
FIG. 1 shows a schematic representation of an electronic device under test in the form of a 2-port (device) with the definitions for the electromagnetic waves $a_n$ and $b_n$ passing into and from the device under test.

FIG. 1 shows a two-port VNA with a port 1 10 and a port 2 12 which is characterized by its scattering matrix [S]. The waves $a_1$ and $a_2$ are the waves, corresponding to the waves $b_1$ and $b_2$ approaching the two-port VNA, propagating in the reverse direction. The relationship is as follows:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}$$

A linear component is adequately described through these S-parameters, which are stated in terms of frequency. In the case of a component which displays nonlinear effects, on feeding a signal with the frequency $f_0$ to one port, signals with this fundamental frequency ($f_o$) and other frequencies are generated at the other ports. These can for example be harmonics with the frequencies $m*f_0$ ($m=2, 3, 4, \ldots$) or, where several transmission generators are used, intermodulation products or mixed products. If one of the transmission generators is modulated, then the number of frequencies is correspondingly great.

The scattering parameters described above can also be used advantageously to describe the transmission behaviors of these nonlinear components. However, it should be taken into consideration that it is necessary to specify not only the ports but also the frequencies. For example, one can insert the vectorial scattering parameter value $S_{21}$ as transmission parameter with the input port 1 10 for the fundamental wave with the frequency $f_0$ and the output port 2 12 for the harmonic with the frequency $f_1=2*f_0$. The prior art for these measurements primarily involves purely scalar set-ups. A number of vectorial network analyzers possess software options which are organized so as to permit measurements of harmonics, intermodulations, mixed products and similar. However, these measurements are only carried out on a scalar basis and thus without any systematic error correction.

With the latest network analyzers (in some cases using additional software and hardware solutions), these nonlinear transmission properties of assembly elements and components are measured as a vectorial value including systematic error correction. This vectorial data is extremely important for the modelling of assembly elements such as transistors.

"Without-Thru" is known from US 2010/0204943 A1 as an innovative systematic error correction method for these nonlinear measurements on vectorial network analyzers. This systematic error correction method requires no through-connections whatsoever (Without Thru). In addition to the three reflection standards Thru, Short and Match or Load, a power sensor and a comb generator are required in order to perform calibrations.

Figure 2:
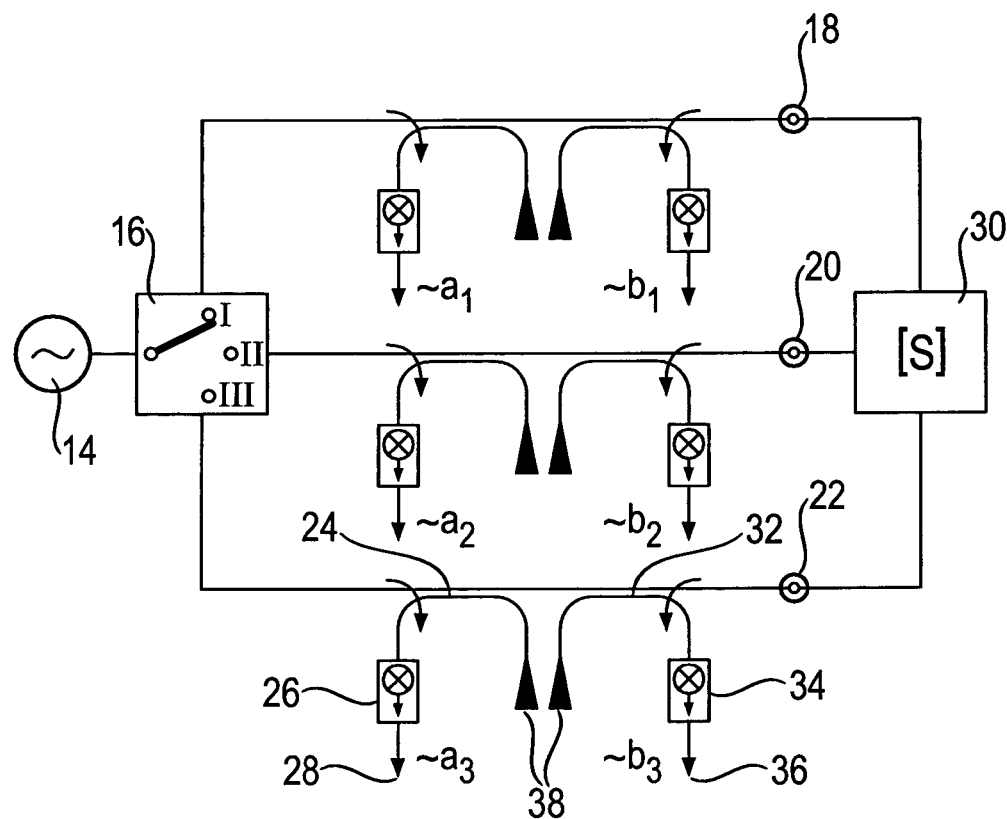
FIG. 2 shows a block diagram of a vectorial three-port network analyzer with changeover switch and six measuring points in accordance with the prior art.

In the prior art, all these systematic error correction methods for the precise determination of linear and nonlinear S-parameters are carried out on network analyzers, the majority of which have 2*n measuring points, where n represents the number of measuring ports. This design is shown in FIG. 2. An RF synthesizer 14 emits a sinusoidal signal which is fed via a changeover switch 16 to a port 1 18, a port 2 20 and a port 3 22. In the switch position III, a portion of the signal is coupled out to a first line coupler 24 and passed to a first measuring point 26. This first measuring point 26 is for example in the form of an A/D converter. In the case of higher frequencies, a mixer (not shown) is installed before the A/D converter which requires an additional local oscillator signal (LO signal). At a first output 28, a signal which is proportional to an emitted wave $a_3$ is fed to an evaluation unit, for example a computer. The greater part of the wave emitted at the port 3 22 runs to a device under test (DUT) 30, where it is reflected and a reflected signal is converted via a second line coupler 32 at a second measuring point 34 and passed to the evaluation unit as a reflected wave $b_3$ via a second output 36. The other two ports of the first and second line couplers 24, 32 are each terminated with a 50 ohm termination 38.

This architecture shown in FIG. 2 is among other things referred to as a reflectometer concept. The numerous calibration methods which are based on the 7-term error model require this reflectometer concept.

In modern network analyzers the changeover switch 16 is replaced by a corresponding arrangement of RF synthesizers, i.e., each measuring port 18, 20, 22 is controlled by its own synthesizer.

Figure 3:
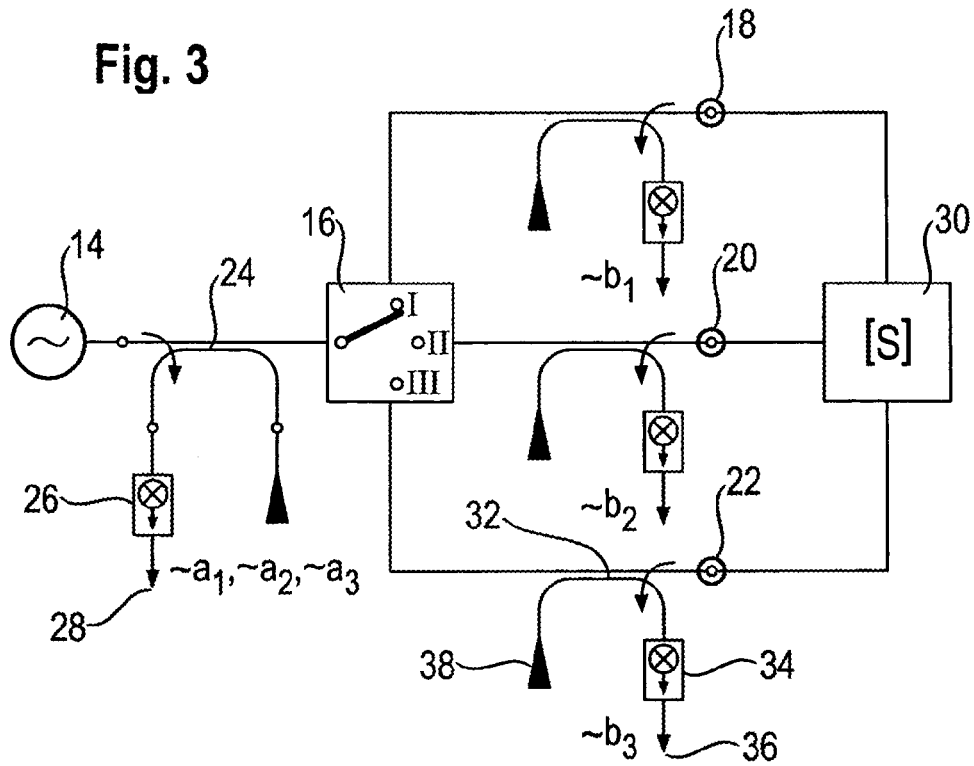
FIG. 3 shows a block diagram of a vectorial three-port network analyzer with changeover switch and four measuring points in accordance with the prior art.

An architecture which requires significantly less investment in hardware is represented in FIG. 3, wherein parts with the same function are identified with the same reference numbers as in FIG. 1, so that they can be explained with reference to the above description of FIG. 1. In distinction to the embodiment in accordance with FIG. 1, the first line directional coupler 34 is arranged upstream of the switch 16 and the corresponding line directional couplers between the switch 16 and the respective ports 18, 20, 22 are dispensed with. The first line directional coupler 34 thus detects the incoming signals $a_1$, $a_2$, and $a_3$ from the RF synthesizer 14. In this concept, only n+1 measuring points are required. One disadvantage of this concept is that in this case only one calibration method can be used. As a two-port measuring device this involves a so-called SOLT (Short-Open-Load-Thru) method, also referred to as a 12-term-method. As a multi-port method it is referred to as a GSOLT-method.

Economical two-port VNAs only operate uni-directionally and thus do not have any changeover switch 16 and only measure the forwards parameters $S_{11}$ and $S_{21}$. These devices have two couplers and three measuring points. The reception measuring point for $b_2$ no longer requires a coupler.

Network analyzers have by far the greatest number of measuring points and are in consequence the most expensive electrical measuring devices. In the field of production engineering, in which the most economical VNAs are used, any simplification of the VNAs is welcome as long as the measuring quality is maintained and the device costs are reduced correspondingly. The advanced user of modern measuring technology wishes to be able to measure vectorial scattering parameters not only at the fundamental frequency but also with frequency conversion, with the smallest possible investment in terms of costs and if possible in real time. However, known solutions for frequency-converting measurements are unacceptably slow in terms of the measuring time. On the other hand, many measurements, for example the vectorial PIM measurement to determine the location of a fault, do not offer the measuring accuracy provided by conventional methods. Moreover, these measurements need to be carried out quickly. However, these cannot be realized in the desired manner since the local oscillator signal (LO signal) also has to be measured with each measurement. The frequency of the LO generator also has to be changed several times in order to enable the emitted, reflected and transmitted portions to be detected.

The invention is based on the problem of simplifying a vectorial network analyzer of the aforementioned type in terms of its mechanical and electronic structure as well as in terms of its operation and the measuring procedure involved. The invention is also based on the problem of accelerating a method of the aforementioned type in terms of the procedure and at the same time achieving a high degree of accuracy.

According to the invention this problem is solved through a vectorial network analyzer of the aforementioned type with the features characterized in the claims.

According to the invention, in a vectorial network analyzer of the aforementioned type, for the RF output signal of at least one signal generator, an amplitude and/or a phase are stored retrievably in the VNA as a function of at least one parameter in a parameter field, wherein the RF signal generator is designed such that it generates the RF output signal reproducibly in amplitude and/or phase as a function of at least this one parameter.

This has the advantage that the RF signal $a_n$ output from the nth measuring port does not need to be measured separately, but can be derived from the parameter field in a desired accuracy. This means that a measuring point for the signals $a_n$ can be dispensed with for the determination of scattering parameters. No reference measuring points are required any more, wherein at the same time the ability to calibrate the network analyzer is not restricted. This makes it possible to measure linear and nonlinear transmission values, in terms of amount and phase, with very low investment in terms of hardware and time. Thus, a measurement of vectorial and frequency-converting scattering parameters for mixers, harmonics or intermodulations, in particular, can be carried out very quickly. The fact that only one measuring point is now required per measuring port means that a network analyzer can be manufactured significantly more economically and in more compact form.

An RF output signal which is particularly well reproducible and stable in phase and amplitude is achieved in that the signal generator is an RF synthesizer.

In order to determine scattering parameters in the frequency domain, the at least one parameter is a frequency of the RF output signal. Other parameters include an output power of the signal generator, an ambient temperature and/or a measuring time per frequency point.

An RF output signal which is reproducible in amplitude and phase is achieved in that at least one of the signal generators has a phase-locked loop (PLL).

In order to measure the RF signals $b_n$ emanating from a device under test in the direction of the measuring ports, each RF coupler is assigned a measuring point which measures the respective RF signal $b_n$.

A particularly good reproducibility of sinusoidal signals at the measuring ports is achieved in that a reference signal, in particular a quartz signal or a quartz oscillator signal (XCO signal), in particular with the frequency 10 MHz, is provided such that this signal triggers a reception of RF signals $b_n$ at the corresponding RF coupler.

A particularly simple and economical VNA combined with high measuring accuracy is achieved in that the measuring point is in the form of an A/D converter.

A particularly good and precise coupling-out of an RF signal is achieved in that at least one RF coupler is in the form of a directional coupler, in particular as a line coupler.

According to the invention, in a method of the aforementioned type at least one electromagnetic wave $a_n$ running into the device under test is determined from a stored parameter field in which the amplitude and/or phase for the electromagnetic wave $a_n$ generated by the signal generator is stored as a function of at least one parameter which influences the generation of the signal by the signal generator, wherein at least one parameter is determined and the amplitude and/or phase of the electromagnetic wave $a_n$ generated by the signal generator is derived from the parameter field for this at least one parameter.

This has the advantage that the RF signal $a_n$ output from the nth measuring port does not need to be measured separately, but can be derived from the parameter field in a desired accuracy. This means that a measuring point for the signals $a_n$ can be dispensed with for the determination of scattering parameters. No reference measuring points are required any more, wherein at the same time the ability to calibrate the network analyzer is not restricted. This makes it possible to measure linear and nonlinear transmission values, in terms of amount and phase, with very low investment in terms of hardware and time. Thus, in particular, a measurement of vectorial and frequency-converting scattering parameters for mixers, harmonics or intermodulations can be carried out very quickly.

An RF output signal which is particularly well reproducible and stable in phase and amplitude is achieved in that the signal generator is an RF synthesizer.

In order to determine scattering parameters in the frequency domain, the at least one parameter is a frequency of the RF output signal. Other parameters include an output power of the signal generator, an ambient temperature and/or a measuring time per frequency point.

An RF output signal which is reproducible in amplitude and phase is achieved in that at least one signal generator with a phase-locked loop (PLL) is coupled with a reference signal, in particular a reference signal of a quartz oscillator.

Figure 4:
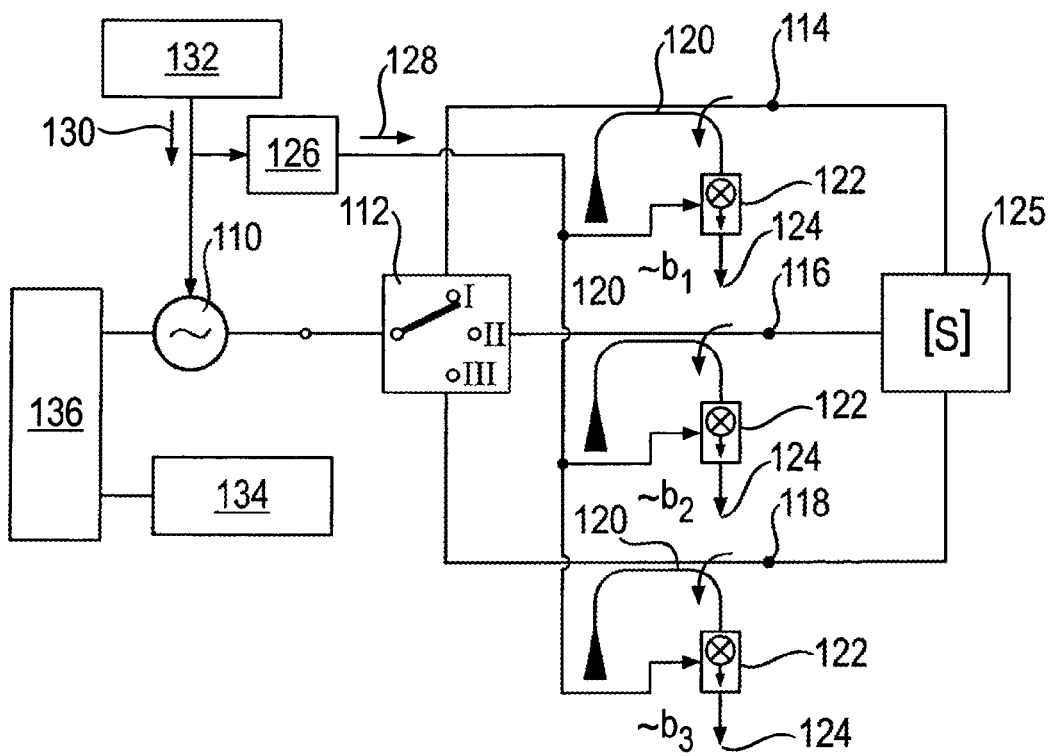
FIG. 4 shows a block diagram of a preferred embodiment of a vectorial network analyzer according to the invention.

The preferred embodiment of a network analyzer according to the invention shown in FIG. 4 possesses a signal generator 110, a changeover switch 112 and the three measuring ports "port 1" 114, "port 2" 116 and "port 3" 118. Each measuring port 114, 116, 118 is assigned an RF coupler 120 in the form of a line coupler, wherein each RF coupler 120 is connected electrically with a measuring point 122. The measuring ports 114, 116 and 118 are connected with corresponding ports of an electronic device under test 125, the scattering parameters (S-parameters) of which are to be determined. This is represented by way of example with a scattering matrix [S]; however, the scattering parameters of a transmission matrix or a chain matrix can also be determined. The term "scattering parameters" is intended to be synonymous with the elements of any matrix which describes the electrical properties of the electronic device under test 125 with respect to the incoming and outgoing waves $a_n$ and $b_n$ or which interrelates these waves $a_n$ and $b_n$ with one another. The RF couplers 120 are arranged such that the RF coupler 120 of the nth port measures the nth wave $b_n$ running away from the device under test 125 into the respective "port n" via the measuring point 122 and outputs this to an associated output 124, wherein n is greater than/equal to 1 and n is less than/equal to N, where N is the number of measuring ports of the vectorial network analyzer. In the example shown in FIG. 4, N is equal to three.

The vectorial network analyzer according to the invention has N measuring points 122, i.e., only N measuring points 122 are now required in order to measure an N-port device. The changeover switch 112 is for example formed by a corresponding number (in this case three) of connectable synthesizers (not shown). The signal generator 110 is for example in the form of an RF synthesizer and at least one local oscillator (mixing oscillator) 126 is provided. The local oscillator 126 supplies a mixing oscillator signal $f_{LO}$ 128 to the measuring points 122. Both the local oscillator 126 and the signal generator 110 are for example phase-locked to a reference signal $f_{ref}$ 130 of a quartz oscillator 132 via a phase-locked loop (PLL).

The at least one signal generator 110 supplies a signal $a_n$, the amplitude and phase of which are known and reproducible. These properties (amplitude and phase) are determined once for the measurement of frequency-converting scattering parameters (S-parameters) as a function of at least one parameter and are stored retrievably in a parameter field 134. The parameter field 134 of the stored signals $a_n$ extends over the frequency and is optionally extended over other values such as an output power of the signal generator 110, an ambient temperature T, a measuring time t per frequency point and others. In other words, the signals $a_n$ generated by the signal generator 110 are stored in the parameter field 134 as a function of at least one parameter. In this way, for a given or known frequency, as exemplary parameter, one can read the wave $a_n$ running to the device under test 125 via the respective "port n" from the parameter field 134 without needing to measure this wave $a_n$ with an additional measuring point.

The output power (amplitude) of the signal generator 110 is regulated through a measuring unit (power detector) which is arranged in a control unit 136. The phase-locking of the signal generator 110 to the mixing oscillator signal $f_{LO}$ is only possible if the divider concept and the phase frequency control are selected appropriately. Thus, modern concepts use sigma-delta dividers which contain random generators. Such synthesizer architectures are not suitable for the VNA according to the invention. The simplest usable divider concept for the VNA according to the invention is the classic PLL construction with several loops and (adjustable) fixed dividers.

The measuring points 122 are for example in the form of analogue/digital converters. In order for reproducible sinusoidal signals to be present at the measuring points 122 in the VNA according to the invention, the reception of the analogue/digital converters is triggered through the reference signal $f_{ref}$ 130 (also referred to as a quartz or XCO signal) of, for example, 10 MHz. The output signal of the VNA according to the invention is generated correctly if, on an oscilloscope which is triggered through the reference signal $f_{ref}$ 130 of the VNA, it is always identical for each frequency point. This property created through the special signal generator 110 transforms a relative measuring device (previous VNA) into an absolute measuring device (VNA according to the invention). Previously, in known VNAs, it was acceptable for the output signals to fluctuate from measurement to measurement. Only the relationship between the two wave values of a reflectometer always had to be reproducible. In contrast, in the VNA according to the invention the measured data must always remain reproducible as an absolute value, from calibration to measurement.

Figure 5:
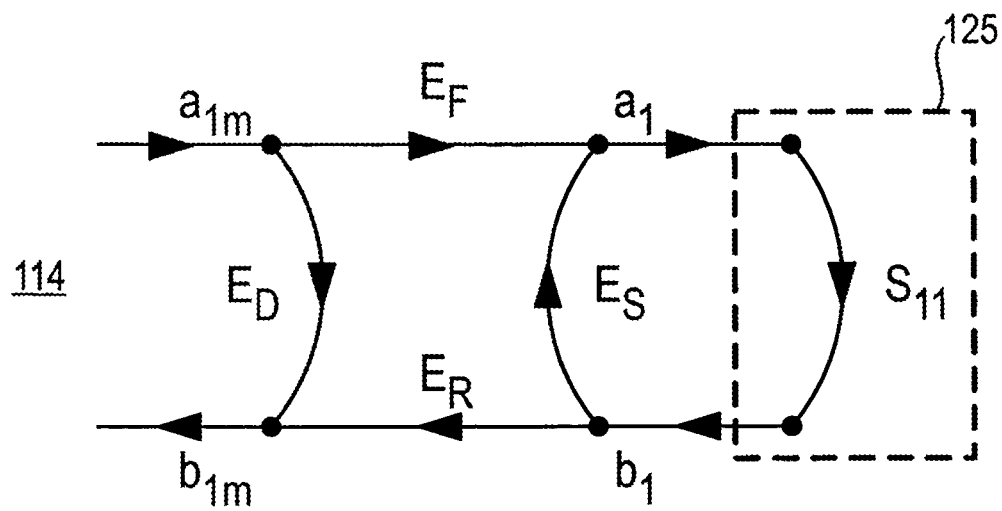
FIG. 5 shows a signal flow diagram of error coefficients for a "port 1" of the vectorial network analyzer according to the invention in accordance with FIG. 4.

The VNA according to the invention is suitable for use for linear measurements, as will be explained in detail in the following. The VNA according to the invention satisfies the 7-term model and can consequently support all VNA calibration methods. For a two-port application, a conventional double reflectometer has four measuring points. In the VNA according to the invention, the two reference measuring points are omitted. However, in order to perform the calibration method, a measured value must be used for the reference measuring points. FIG. 5 shows the situation in the form of a signal flow diagram of the error coefficients with reference to the example of "port 1" 114. $a_{1m}$ is the measured value of the reference measuring point, $a_1$ is the reproducible wave at the measuring port 1. $b_1$ is the wave emanating from the device under test 125. $b_{1m}$ is the measured value at the reference measuring point. $E_D$ is an error coefficient which interrelates $a_{1m}$ and $b_{1m}$ ($b_{1m}=E_D*a_{1m}$) and describes a crosstalk of $a_{1m}$. $E_F$ is an error coefficient which interrelates $a_{1m}$ and $a_1$ ($a_1=E_F*a_{1m}$). $E_R$ is an error coefficient which interrelates $b_1$ and $b_{1m}$ ($b_{1m}=E_R*b_1$). $E_S$ is an error coefficient which interrelates $b_1$ with $a_1$ ($a_1=E_S*b_1$) and describes a crosstalk of $b_1$. $S_{11}$ is a scattering parameter of the scattering matrix which describes an input reflection factor for the device under test 125 with adapted output of the device under test 125. The reception value $b_{1m}$ of the sole measuring point of the VNA according to the invention displays a crosstalk of $a_{1m}$. Here, the approximation can be made that $E_D$ is zero. In practice, $E_D$ is low, with values between −35 dB and −20 dB. This approximation leads to an error of a few tenths of a dB in reflection measurements. In transmission measurements, the error is scarcely expressible. However, in this case the error coefficients are reduced and simplified calibration methods can be used.

For the general case that $E_D$ is not equal to zero and $a_1$ is reproducible, any value (e.g., 1) can be used for $a_{1m}$. $E_F$ is only calculated from the ratio $a_1/a_{1m}$. For the calibration measurement with the 50 ohm termination, $E_D$ is calculated from the ratio $b_{1m}/a_{1m}$.

If $a_{1m}$ is defined as any value (e.g. 1), then $E_D$ and $E_F$ do not correspond to any physical transmission values. Nor is this necessary in practice. If the VNA according to the invention is only used for linear measurements, then it is not necessary to know the wave $a_1$. Any limitation in the measuring accuracy of the network analyzer depends solely on the reproducibility of the generator signals. However, with the correct design, this is very high with RF electronics.

The VNA according to the invention is also suitable for use for nonlinear measurements, as will be explained in detail in the following. For nonlinear measurements, the first big difference in comparison with the prior art is the fact that a measuring point for a comb generator measurement is no longer necessary. The hardware corresponds to that of the VNA according to the invention for linear measurements. Generally, any known calibration method for frequency-converting measurements can be performed with the VNA according to the invention, setting the measured data of the reference measuring points to a fixed value. However, the high reproducibility of the signal generators 110 offers new possibilities. Thus, the VNA according to the invention now only needs to be calibrated once, in a completely frequency-converting manner, at measuring adaptors (before the measuring cables). Because of their reciprocity, the errors in the linear measuring cables can be calibrated out individually with a standard calibration method used in linear measuring technology (e.g., MSO).

The present invention allows a VNA to be realized, using only one measuring point per measuring port, which can measure linear and nonlinear scattering parameters (S-parameters). It is thus possible, with a reduction in hardware in comparison with the prior art, to use a VNA for the measurement of linear components as well as for the measurement of nonlinear components. The omission of the reference measuring points means that fewer measurements have to be carried out, which results in a faster measuring time. This effect is particularly evident with frequency-converting measurements. These can be carried out in real time with this new architecture (n-measuring point concept). The hardware requirements for the linear device and the frequency-converting device are substantially identical.

The principle of network analysis can be applied in many other fields. These include, among others, radar technology, filling-level measurement and humidity measurement. These listed measurements are often carried out in the open using antennas. A calibration can be carried out in front of the antenna or in the open. The measuring accuracy is improved in comparison with known solutions through the reduction in the necessary hardware. For example, a current FMCW radar has one measuring point and cannot be calibrated like a VNA. With the present invention, a radar also has only one measuring point. In this case, the crosstalk from the transmitter to the one measuring point can be calculated out. Whereas an FMCW radar only measures the real part of the transmission function, a radar device equipped with the present invention can measure the complex transmission function and thus displays a significantly higher measuring accuracy.

In a method according to the invention, the wave $a_1$ is no longer measured, as is usual in the prior art, but read from the parameter field 134. For this purpose, at least one parameter is first determined by the control unit 136 which has an influence on the generation of the wave $a_1$ through the signal generator 110. These are, for example, a frequency adjusted on the signal generator 110 and, optionally, other parameters such as the output power set on the signal generator 110 and/or the ambient temperature T. With this or these parameters, desired values for the wave $a_1$, such as the amplitude and/or phase, are then read from the parameter field 134. For this purpose, a value for amplitude and/or phase for the wave $a_1$ is stored unequivocally in the parameter field 134 for each value of the parameter(s). These values for amplitude and/or phase for the wave $a_1$ are then used for the further calculation of, for example, the scattering parameters $S_{11}$ of the scattering matrix.

The parameter field 134 only needs to be created once for the signal generator. For this purpose, the values for amplitude and/or phase are determined once, by measurement, for different values of at least one parameter and are stored in the parameter field 134.

In the case of frequency-converting measurements, such as vectorial PIM, the network analyzer is only calibrated once on a fully frequency-converting basis. Thereafter, only a standard calibration (such as MSO) takes place for the purpose of measuring cable calculation. A measuring point for a phase error of the local oscillator 126 is no longer required for frequency-converting measurements.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A vectorial network analyzer (VNA) for determining scattering parameters of an electronic device under test comprising at least one signal generator which generates a particular RF output signal, and n measuring ports, where n is an integer greater than or equal to one, wherein an RF coupler is assigned to each measuring port and couples out an RF signal $b_n$ running into the particular port from the outside, wherein the at least one signal generator is arranged and designed in such a manner that the latter supplies a particular RF output signal to at least one measuring port as an RF signal $a_n$ running out to the outside, wherein for the RF output signal of said at least one signal generator, an amplitude and/or a phase are stored retrievably in the VNA as a function of at least one parameter in a parameter field such that the RF signal $a_n$ does not need to be measured separately, but can be derived from the parameter field, wherein the at least one signal generator generates the RF output signal reproducibly in amplitude and/or phase as a function of at least this one parameter, wherein the at least one signal generator is coupled to a reference signal of a quartz oscillator.

2. The vectorial network analyzer of claim 1 wherein the at least one signal generator includes an RF synthesizer.

3. The vectorial network analyzer of claim 1 wherein the at least one parameter is a frequency of the RF output signal, an output power of the at least one signal generator, an ambient temperature, or a measuring time per frequency point, or any combination thereof.

4. The vectorial network analyzer of claim 1, wherein said at least one signal generator has a phase-locked loop (PLL).

5. The vectorial network analyzer of claim 1, wherein each RF coupler is assigned a measuring point which measures the respective RF signal $b_n$.

6. The vectorial network analyzer of claim 5 wherein the reference signal having a frequency of 10 MHz is provided such that this signal triggers a reception of RF signals $b_n$ at the corresponding RF coupler.

7. The vectorial network analyzer of claim 6 wherein the measuring point is in the form of an A/D converter.

8. The vectorial network analyzer of claim 7 wherein said RF coupler is a directional coupler.

9. The vectorial network analyzer of claim 5 wherein the measuring point is in the form of an A/D converter.

10. The vectorial network analyzer of claim 1 wherein said RF coupler is a directional coupler.

11. The vectorial network analyzer of claim 10 wherein said RF coupler is a line coupler.

12. The vectorial network analyzer of claim 1 wherein the at least one parameter is a frequency of the RF output signal, an output power of the signal generator, an ambient temperature, or a measuring time per frequency point, or any combination thereof.

13. The vectorial network analyzer of claim 12, wherein said at least one signal generator has a phase-locked loop (PLL).

14. The vectorial network analyzer of claim 12, wherein each RF coupler is assigned a measuring point which measures the respective RF signal $b_n$.

15. The vectorial network analyzer of claim 14 wherein the reference signal having a frequency of 10 MHz is provided such that this signal triggers a reception of RF signals $b_n$ at the corresponding RF coupler.

* * * * *